US011798600B2

(12) United States Patent
Rai et al.

(10) Patent No.: US 11,798,600 B2
(45) Date of Patent: Oct. 24, 2023

(54) READ ACCELERATOR CIRCUIT

(71) Applicant: Avago Technologies International Sales Pte. Limited, Singapore (SG)

(72) Inventors: Dharmendra Kumar Rai, Bengaluru (IN); Mohit Gupta, Bengaluru (IN); Bijan Kumar Ghosh, Bangalore (IN); Mohammed Rahim Chand Seikh, Bangalore (IN)

(73) Assignee: Avago Technologies International Sales Pte. Limited, Singapore (SG)

( * ) Notice: Subject to any disclaimer, the term of this patent is extended or adjusted under 35 U.S.C. 154(b) by 63 days.

(21) Appl. No.: 17/518,486

(22) Filed: Nov. 3, 2021

(65) Prior Publication Data

US 2023/0133050 A1    May 4, 2023

(51) Int. Cl.
  *G11C 7/06*    (2006.01)
(52) U.S. Cl.
  CPC ........ *G11C 7/065* (2013.01); *G11C 2207/065* (2013.01)
(58) Field of Classification Search
  CPC .................. G11C 7/065; G11C 2207/065
  See application file for complete search history.

(56) References Cited

U.S. PATENT DOCUMENTS

2003/0025532 A1*   2/2003   Telecco ................. G11C 7/065
                                                327/54
2020/0274528 A1*   8/2020   Lenz ................... H01L 27/0629

FOREIGN PATENT DOCUMENTS

| CN | 102708918 | 10/2012 |
| JP | 08-203274 | 8/1996 |
| KR | 20090107632 A | * 10/2009 |

OTHER PUBLICATIONS

Circuit For Transmitting Data Of Semiconductor Memory Apparatus; Song Keun Soo (Year: 2009).*
Extended European Search Report on EP 22204363.0 dated Mar. 6, 2023.

* cited by examiner

*Primary Examiner* — Sultana Begum
(74) *Attorney, Agent, or Firm* — Foley & Lardner LLP

(57) ABSTRACT

An accelerator circuit is provided that includes an inverter chain having an input coupled to a data line and a sense circuit having inputs coupled to an output of the inverter chain and the data line. The sense circuit is configured to sense a rise toward a supply voltage on the data line or a fall toward a ground voltage on the data line. The accelerator circuit further includes an amplify circuit having inputs coupled to outputs of the sense circuit and an output coupled to the data line, where the amplify circuit is configured to amplify the data line toward the supply voltage or toward the ground voltage based on amplify enable signals output by the sense circuit.

8 Claims, 3 Drawing Sheets

READ ACCELERATOR CIRCUIT

TECHNICAL FIELD

The present description relates generally to sense circuits including circuits for sensing and amplifying transitions on data lines.

BACKGROUND

With each generation of semiconductor fabrication technology, feature sizes decrease. However, the resistances of the metal layers used in the semiconductor fabrication are not scaling in the same proportion as transistor sizing. Metal resistances can impede improvements in performance otherwise available with smaller features sizes.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

Figure 1:
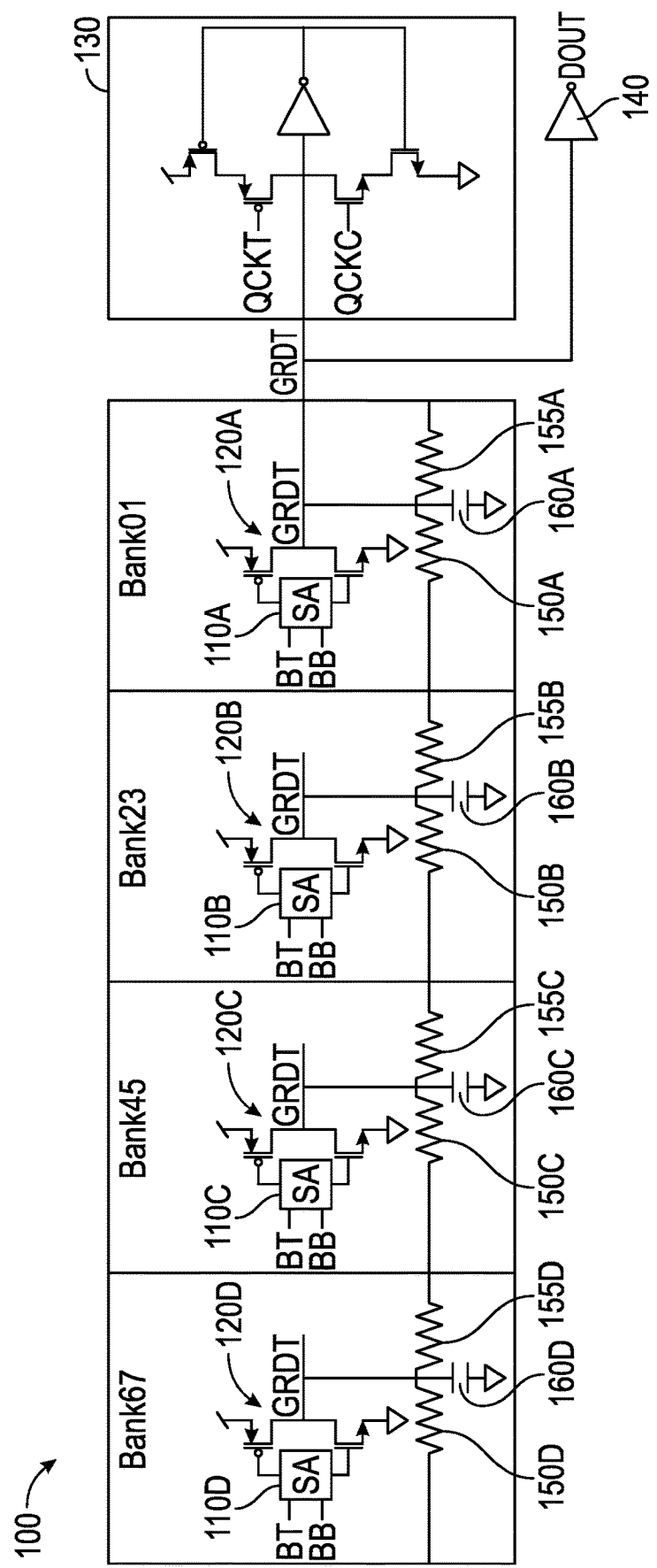
FIG. 1 illustrates a static random-access memory (SRAM) architecture according to aspects of the subject technology.

FIG. 1 illustrates a static random-access memory (SRAM) architecture according to aspects of the subject technology. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

SRAM architecture 100 depicts an arrangement of sense amplifiers and data line drivers used for eight banks of memory. In this regard, an improvement in performance is sought by using a sense amplifier and data line driver for each pair of memory banks. For example, the complementary bit lines of memory banks 0 and 1 are coupled to the inputs of sense amplifier 110A, and the outputs of sense amplifier 110A are coupled to the inputs of data line driver 120A, which together form a local output circuit. Similarly, the complementary bit lines of memory banks 2 and 3 are coupled to the inputs of sense amplifier 110B, and the outputs of sense amplifier 110B are coupled to the inputs of data line driver 120B; the complementary bit lines of memory banks 4 and 5 are coupled to the inputs of sense amplifier 110C, and the outputs of sense amplifier 110C are coupled to the inputs of data line driver 120C; and the complementary bit lines of memory banks 6 and 7 are coupled to the inputs of sense amplifier 110D, and the outputs of sense amplifier 110D are coupled to the inputs of data line driver 120D. The read value on the data line GRDT is latched by output latch 130 and is passed through inverter 140 to be output as DOUT.

As SRAM architectures add more banks of memory, the length of the data lines increases resulting in higher resistances on the data lines. These resistances are represented in FIG. 1 by resistors 150A-D and 155A-D. The increased length of the data lines also increases capacitance on the data lines. This additional capacitance is in addition to the capacitance introduced by the respective data line drivers 120A-120D. These capacitances are represented in FIG. 1 by capacitors 160A-D. The increases in resistance and capacitance degrades the rise and fall times on the data line and presents a bottleneck in achieving better performance in the SRAM architectures.

Figure 2:
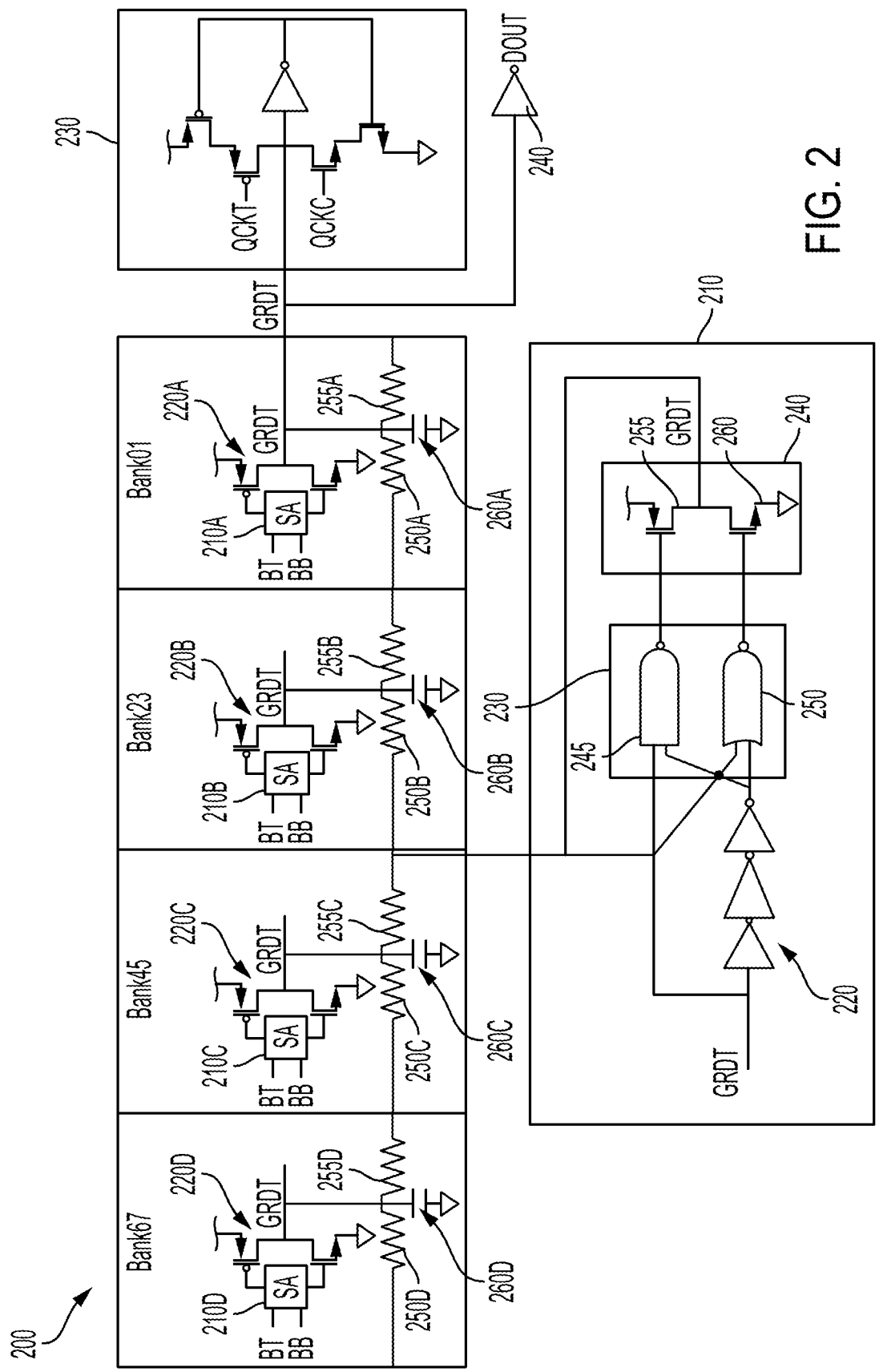
FIG. 2 illustrates a static random-access memory (SRAM) architecture according to aspects of the subject technology.

FIG. 2 illustrates a static random-access memory (SRAM) architecture according to aspects of the subject technology. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

The SRAM architecture 200 depicted in FIG. 2 includes an arrangement of sense amplifiers 110A-D, data line drivers 120A-D, output latch 130, and inverter 140 as depicted in FIG. 1. To combat the increases in rise and fall times caused by the longer data lines and the higher number of data line drivers, the subject technology adds read accelerator circuit 210 to the SRAM architecture. As represented in FIG. 2, read accelerator circuit 210 is coupled to the data line GRDT between banks 2 and 3 and banks 4 and 5 of the SRAM. The subject technology is not limited to this arrangement and may place read accelerator circuit 210 at another location along data line GRDT. In addition, more than one read accelerator circuit 210 may be used at different locations along data line GRDT.

Read accelerator circuit 210 include inverter chain 220, sense circuit 230, and amplify circuit 240. Sense circuit 230 is configured to sense a rise toward a supply voltage or fall towards a ground voltage in the voltage level on the data line GRDT and generate amplify enable signals used by amplify circuit 240. Amplify circuit 240 is configured to drive or amplify the data line voltage towards the supply voltage when a rise is sensed on the data line GRDT by sense circuit 230, and drive or amplify the data line voltage towards the ground voltage when a fall is sensed on the data line GRDT by sense circuit 230.

According to aspects of the subject technology, sense circuit 230 includes NAND gate 245 and NOR gate 250, and amplify circuit 240 includes p-channel transistor 255 and n-channel transistor 260. A first input of each of NAND gate 245 and NOR gate 250 is coupled to the data line GRDT. A second input of each of NAND gate 245 and NOR gate 250 is coupled to the output of inverter chain 220, with the data line GRDT being coupled to the input of inverter chain 220.

The output of NAND gate 245 is coupled to the gate of p-channel transistor 255, with the source of p-channel transistor 255 being coupled to a supply voltage and the drain of p-channel transistor 255 being coupled to the data line GRDT. The output of NOR gate 250 is coupled to the gate of n-channel transistor 260, with the source of n-channel transistor 260 being coupled to a ground voltage and the drain of n-channel transistor 260 being coupled to the data line GRDT and the drain of p-channel transistor 255.

As can be seen from FIG. 2, the data line GRDT is the only input to read accelerator circuit 210 with no other control signals being required for operation of read accelerator circuit 210. This arrangement simplifies the design and avoids additional control signal that would need to be synchronized with other signals used in the SRAM architecture.

Figure 3:
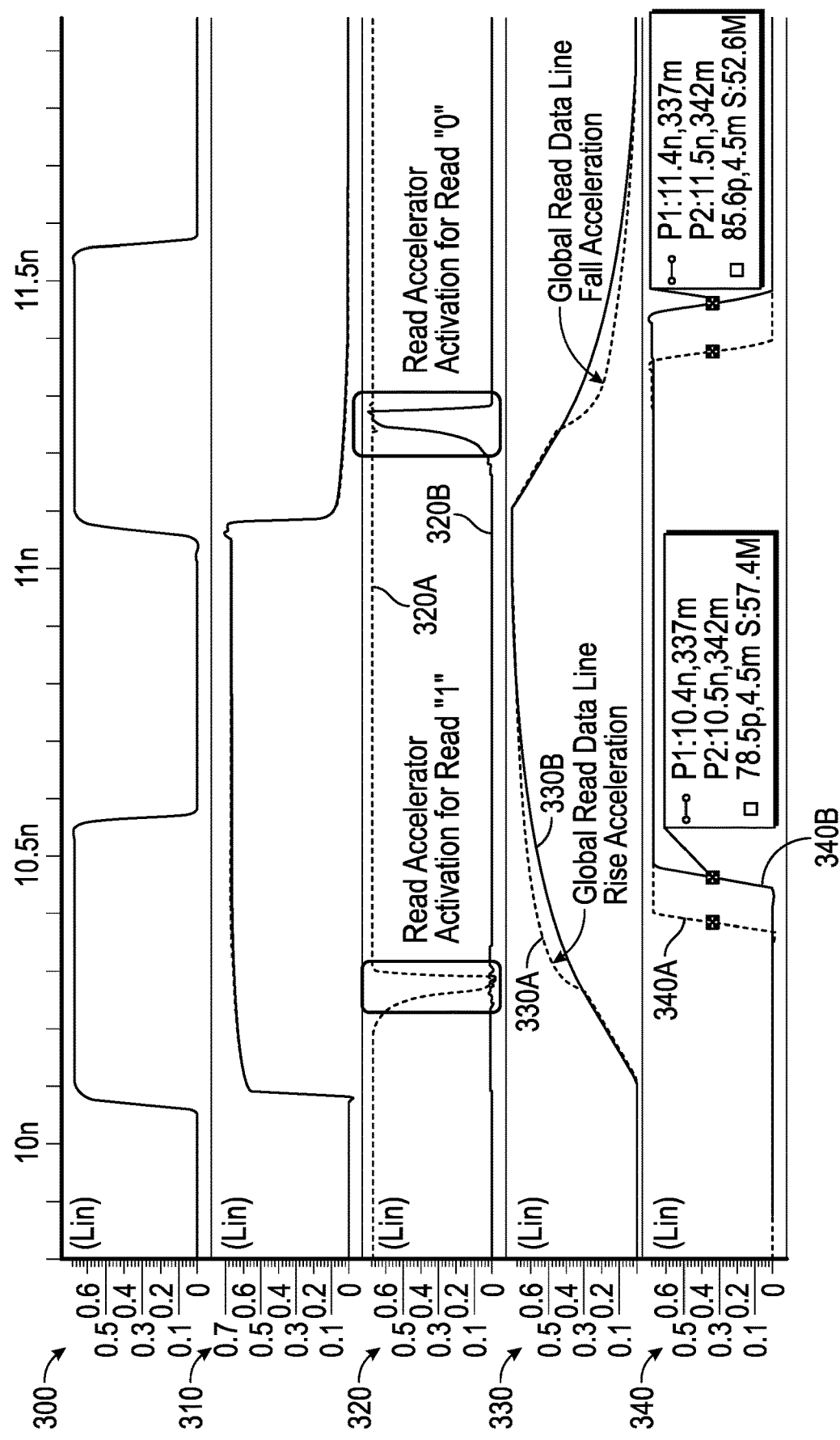
FIG. 3 is a series of graphs illustrating the operation of a read accelerator circuit according to aspects of the subject technology.

FIG. 3 is a series of graphs illustrating the operation of read accelerator circuit 210 according to aspects of the subject technology. Graph 300 represents a sense amplifier enable signal that activates a sense amplifier of a memory bank being read when the signal goes high. For example, when the signal goes high shortly after 10 nsec sense amplifier 110D may be enabled to read data out of memory bank 7. Graph 310 represents the signal driven by the data line driver at the memory bank being read. For example, in the first depicted instance of the sense amplifier enable signal going high, a "1" is read by sense amplifier 110D and the corresponding high signal is driven by data line driver 120D on the data line GRDT. In the second depicted instance of the sense amplifier enable signal going high, a "0" is read by sense amplifier 110D and the corresponding low signal is driven by data line driver 120D on the data line GRDT.

Graphs 320A and 320B illustrate amplify enable signals generated within read accelerator circuit 210. When the "1" is being read by sense amplifier 110D and data line driver 120D drives the signal on data line GRDT high towards the supply voltage, the output of NAND gate 245 drops towards the ground voltage and acts as an amplify enable signal to turn on p-channel transistor 255. With p-channel transistor 255 turned on, the data line GRDT is driven towards the supply voltage by p-channel transistor 255. Similarly, when the "0" is being read by sense amplifier 110D and data line driver 120D drives the signal on data line GRDT low towards the ground voltage, the output of NOR gate 250 rises towards the supply voltage and acts as an amplify enable signal to turn on n-channel transistor 260. With n-channel transistor 260 turned on, the data line is driven towards the ground voltage by n-channel transistor 260.

The duration or pulse width of the amplify enable signals generated by sense circuit 230 is controlled by inverter chain 220. Choosing the type of inverter with different inherent delays and the number of inverters in the chain allows the duration or pulse width of the amplify signals to be increased with longer delays and/or more inverters in the chain, or decreased with shorter delay and/or fewer inverters in the chain. The inverter chain 220 depicted in FIG. 2 shows a chain made up of three inverters. The subject technology is not limited to inverter chains made up of three inverters and may include more or fewer inverters depending on the desired pulse width of the amplify enable signals.

Graphs 330A and 330B illustrate the levels on the data line GRDT closer to output latch 130 with and without read accelerator circuit 210 in operation, respectively. As shown in the graphs, the level on the data line GRDT rises more quickly with the assistance of read accelerator circuit 210 and falls more quickly with the assistance of read accelerator circuit 210. Benefits of this improvement in performance are illustrated in Graphs 340A and 340B which show the levels on the output signal DOUT of output latch 130 with and without read accelerator circuit 210, respectively. In the example illustrated in Graphs 340A and 340B, a read "1" appears on DOUT 78.5 psec more quickly when read accelerator circuit 210 is used and a read "0" appears on DOUT 85.6 psec more quickly when read accelerator circuit 210 is used.

Read accelerator circuit 210 has been described above in the contexts of SRAM architectures. However, the subject technology is not limited to SRAM architectures. Read accelerator circuit 210 has the capability to improve any system involving high resistance line sensing and amplification.

According to aspects of the subject technology, a circuit is provided that includes a plurality of memory banks, and for each pair of memory banks, a local output circuit. The local output circuit includes a sense amplifier having inputs coupled to complimentary bit lines of the pair of memory banks, and a data line driver having inputs coupled to outputs of the sense amplifier, and an output coupled to a data line. The circuit further includes an output latch coupled to the data line and a read accelerator circuit. The read accelerator circuit includes an inverter chain having an input coupled to the data line, a sense circuit having inputs coupled to an output of the inverter chain and the data line, wherein the sense circuit is configured to sense a rise toward a supply voltage on the data line or a fall toward a ground voltage on the data line, and an amplify circuit having inputs coupled to outputs of the sense circuit and an output coupled to the data line. The amplify circuit is configured to amplify the data line toward the supply voltage or toward the ground voltage based on amplify enable signals output by the sense circuit.

The sense circuit includes a NAND gate having a first input coupled to the data line and a second input coupled to the output of the inverter chain, and a NOR gate having a first input coupled to the data line and a second input coupled to the output of the inverter chain. The amplify circuit includes a p-type transistor and an n-type transistor, where the source of the p-type transistor is coupled to the supply voltage, the gate of the p-type transistor is coupled to the output of the NAND gate, and the drain of the p-type transistor is coupled to the data line, and where the source of the n-type transistor is coupled to the ground voltage, the gate of the n-type transistor is coupled to the output of the NOR gate, and the drain of the n-type transistor is coupled to the data line. The inverter chain includes three inverters arranged serially.

According to aspects of the subject technology, an accelerator circuit is provided that includes an inverter chain having an input coupled to a data line and a sense circuit having inputs coupled to an output of the inverter chain and the data line. The sense circuit is configured to sense a rise toward a supply voltage on the data line or a fall toward a ground voltage on the data line. The accelerator circuit further includes an amplify circuit having inputs coupled to outputs of the sense circuit and an output coupled to the data line, where the amplify circuit is configured to amplify the data line toward the supply voltage or toward the ground voltage based on amplify enable signals output by the sense circuit.

The sense circuit includes a NAND gate having a first input coupled to the data line and a second input coupled to the output of the inverter chain, and a NOR gate having a first input coupled to the data line and a second input coupled to the output of the inverter chain. The amplify circuit includes a p-type transistor and an n-type transistor, where the source of the p-type transistor is coupled to the supply voltage, the gate of the p-type transistor is coupled to the output of the NAND gate, and the drain of the p-type transistor is coupled to the data line, and where the source of the n-type transistor is coupled to the ground voltage, the gate of the n-type transistor is coupled to the output of the NOR gate, and the drain of the n-type transistor is coupled to the data line. The inverter chain includes three inverters arranged serially.

The meaning term "coupled" is not intended to be limited to a direct, physical connection between two components. As used herein, the term "coupled" may include both direct and indirect connections between components. Indirect connections may include one or more intermediate components positioned between two coupled components.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit, comprising:
    a plurality of memory banks;
    for each pair of memory banks, a local output circuit comprising:
        a sense amplifier having inputs coupled to complimentary bit lines of the pair of memory banks; and
        a data line driver having inputs coupled to outputs of the sense amplifier, and an output coupled to a data line;
    an output latch coupled to the data line; and
    a read accelerator circuit comprising:
        an inverter chain having an input coupled to the data line;
        a sense circuit having inputs coupled to an output of the inverter chain and the data line, wherein the sense circuit is configured to sense a rise toward a supply voltage on the data line or a fall toward a ground voltage on the data line; and
        an amplify circuit having inputs coupled to outputs of the sense circuit and an output coupled to the data line, wherein the amplify circuit is configured to amplify the data line toward the supply voltage or toward the ground voltage based on amplify enable signals output by the sense circuit.

2. The circuit of claim 1, wherein the sense circuit comprises:
    a NAND gate having a first input coupled to the data line and a second input coupled to the output of the inverter chain; and
    a NOR gate having a first input coupled to the data line and a second input coupled to the output of the inverter chain.

3. The circuit of claim 2, wherein the amplify circuit comprises:
    a p-type transistor; and
    an n-type transistor,
    wherein the source of the p-type transistor is coupled to the supply voltage, the gate of the p-type transistor is coupled to the output of the NAND gate, and the drain of the p-type transistor is coupled to the data line, and wherein the source of the n-type transistor is coupled to the ground voltage, the gate of the n-type transistor is coupled to the output of the NOR gate, and the drain of the n-type transistor is coupled to the data line.

4. The circuit of claim 1, wherein the inverter chain comprises three inverters arranged serially.

5. An accelerator circuit, comprising:
an inverter chain having an input coupled to a data line;
a sense circuit having inputs coupled to an output of the inverter chain and the data line, wherein the sense circuit is configured to sense a rise toward a supply voltage on the data line or a fall toward a ground voltage on the data line; and
an amplify circuit having inputs coupled to outputs of the sense circuit and an output coupled to the data line, wherein the amplify circuit is configured to amplify the data line toward the supply voltage or toward the ground voltage based on amplify enable signals output by the sense circuit.

6. The accelerator circuit of claim 5, wherein the sense circuit comprises:

a NAND gate having a first input coupled to the data line and a second input coupled to the output of the inverter chain; and
a NOR gate having a first input coupled to the data line and a second input coupled to the output of the inverter chain.

7. The accelerator circuit of claim 6, wherein the amplify circuit comprises:
a p-type transistor; and
an n-type transistor,
wherein the source of the p-type transistor is coupled to the supply voltage, the gate of the p-type transistor is coupled to the output of the NAND gate, and the drain of the p-type transistor is coupled to the data line, and
wherein the source of the n-type transistor is coupled to the ground voltage, the gate of the n-type transistor is coupled to the output of the NOR gate, and the drain of the n-type transistor is coupled to the data line.

8. The accelerator circuit of claim 5, wherein the inverter chain comprises three inverters arranged serially.

* * * * *